US012666698B2

(12) United States Patent
Montaque et al.

(10) Patent No.: US 12,666,698 B2
(45) Date of Patent: Jun. 23, 2026

(54) POLYSILICON RESISTOR ALIGNED BETWEEN GATE STRUCTURES

(71) Applicant: GlobalFoundries U.S. Inc., Malta, NY (US)

(72) Inventors: Marvin G. L. Montaque, Burlington, VT (US); Cathryn J. Christiansen, Richmond, VT (US); Craig B. Beucler, South Burlington, VT (US); Timothy W. Kemerer, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 539 days.

(21) Appl. No.: 18/327,107

(22) Filed: Jun. 1, 2023

(65) Prior Publication Data

US 2024/0405019 A1    Dec. 5, 2024

(51) Int. Cl.
H10D 84/40          (2025.01)
H10D 1/47           (2025.01)
H10D 84/01          (2026.01)
H10D 84/03          (2025.01)

(52) U.S. Cl.
CPC ............ H10D 84/403 (2025.01); H10D 1/47 (2025.01); H10D 84/0109 (2025.01); H10D 84/038 (2025.01)

(58) Field of Classification Search
CPC .... H10D 1/47; H10D 84/0109; H10D 84/038; H10D 84/403; H10D 84/817
See application file for complete search history.

(56) References Cited

U.S. PATENT DOCUMENTS

| | | | | |
|---|---|---|---|---|
| 5,304,502 A | * | 4/1994 | Hanagasaki | ......... H10D 89/911 |
| | | | | 438/210 |
| 5,909,617 A | | 6/1999 | Manning et al. | |
| 6,090,648 A | | 7/2000 | Reedy et al. | |
| 6,362,067 B1 | | 3/2002 | Hall | |
| 7,241,663 B2 | | 7/2007 | Howard et al. | |
| 8,779,546 B1 | | 7/2014 | Tsukamoto et al. | |
| 2007/0075374 A1 | * | 4/2007 | Kudou | ............... H10D 84/0137 |
| | | | | 257/E21.624 |
| 2014/0231952 A1 | * | 8/2014 | Hahn | ................. H10D 30/0221 |
| | | | | 257/488 |
| 2015/0262995 A1 | * | 9/2015 | Huo | ........................ H10D 30/64 |
| | | | | 438/238 |
| 2017/0256535 A1 | * | 9/2017 | Nandakumar | ........... H10D 1/47 |
| 2024/0014245 A1 | * | 1/2024 | Chung | .................. H10F 39/809 |
| 2024/0315017 A1 | * | 9/2024 | Liu | .................... H10D 30/0411 |

FOREIGN PATENT DOCUMENTS

| | | |
|---|---|---|
| EP | 0545363 A1 | 6/1993 |
| EP | 1075016 A2 | 2/2001 |

* cited by examiner

*Primary Examiner* — Shaun M Campbell
(74) *Attorney, Agent, or Firm* — Francois Pagette; Hoffman Warnick LLC

(57) ABSTRACT

A structure includes a first gate structure spaced from a second gate structure in a field effect transistor (FET) area of a substrate. A polysilicon resistor is in a space between the first gate structure and the second gate structure. The polysilicon resistor has a lower surface that is farther from the substrate than lower surfaces of the polysilicon bodies of the first and second gate structures. The polysilicon resistor may have a different polarity dopant compared to at least one of the polysilicon bodies of the first and second gate structures.

20 Claims, 7 Drawing Sheets

POLYSILICON RESISTOR ALIGNED BETWEEN GATE STRUCTURES

BACKGROUND

The present disclosure relates to integrated circuit (IC) structures and, more particularly, to a polysilicon resistor that is aligned between gate structures.

Resistors are used in IC structures for a number of purposes. For example, in radio frequency (RF) applications such as power amplifiers, polycrystalline resistors may be provided to help regulate voltage flowing in the IC structure to avoid overloads. One challenge with forming resistors is that they often require additional mask steps to form them in a desired manner. For example, polysilicon resistors are oftentimes formed at the same time as gate polysilicon bodies but in a different area and directly in contact with a substrate, e.g., over a trench isolation in a silicon substrate with no gate dielectric layer therebetween. Since the polysilicon resistors are not self-aligned with any other structure, they require additional masking steps to ensure a desired configuration. The additional masking steps are time-consuming and expensive.

SUMMARY

All aspects, examples and features mentioned below can be combined in any technically possible way.

An aspect of the disclosure provides a structure, comprising: a first gate structure spaced from a second gate structure in a field effect transistor (FET) area of a substrate, the first and second gate structures each including a polysilicon body; and a polysilicon resistor in a space between the first gate structure and the second gate structure, wherein the polysilicon resistor has a lower surface that is farther from the substrate than lower surfaces of the polysilicon bodies of the first and second gate structures.

An aspect of the disclosure provides a structure, comprising: a field effect transistor (FET) area of a substrate including a first gate structure spaced from a second gate structure, wherein each of the first and second gate structures includes a polysilicon body having a lower surface; and a self-aligned polysilicon resistor in a space between the first gate structure and the second gate structure, wherein the self-aligned polysilicon resistor has a lower surface that is farther from the substrate than the lower surfaces of the polysilicon bodies of the first and second gate structures.

An aspect of the disclosure provides a method, comprising: forming a first gate structure spaced from a second gate structure over a field effect transistor (FET) area of a substrate; forming a first polysilicon layer over the first gate structure and the second gate structure and over a bipolar junction transistor area of the substrate, the first polysilicon layer filling a space between the first gate structure and the second gate structure; and using the first polysilicon layer, forming a polysilicon resistor in a space between the first gate structure and the second gate structure and forming a first portion of a bipolar junction transistor (BJT) in a bipolar junction transistor area of the substrate.

Two or more aspects described in this disclosure, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein.

Figure 1:
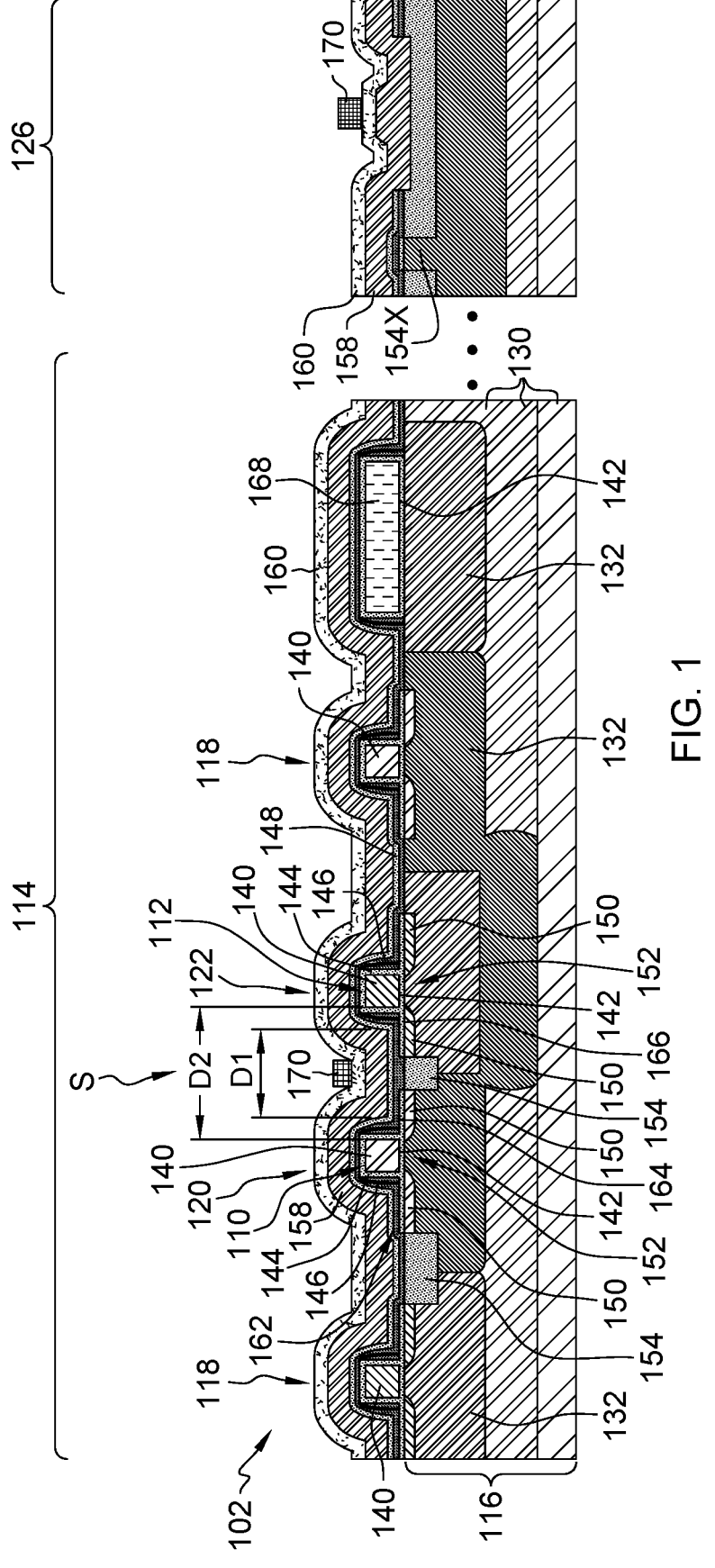
FIG. 1 shows a cross-sectional view of a preliminary structure for a method of forming a structure including a polysilicon resistor, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include a structure including a first gate structure spaced from a second gate structure in a field effect transistor (FET) area of a substrate. The first and second gate structures each include a polysilicon body. A polysilicon resistor is in a space between the first gate structure and the second gate structure. The polysilicon resistor has a lower surface that is farther from the substrate than lower surfaces of the polysilicon bodies of the first and second gate structures because they are made of different polysilicon layers. The polysilicon resistor may have a different polarity dopant compared to at least one of the polysilicon bodies of the first and second gate structures. The polysilicon resistor may be formed as part of a same polysilicon layer used for a portion of a bipolar junction transistor (BJT) in a BJT area of the substrate. The polysilicon resistor does not require any additional mask steps, saving time and expense of fabricating the resistors.

FIGS. 1-5 show cross-sectional views of a method of forming a structure 100 (FIG. 4), according to embodiments of the disclosure. FIG. 1 shows a preliminary structure 102 in which is already formed a first gate structure 110 spaced from a second gate structure 112 over a field effect transistor (FET) area 114 of a substrate 116. Other gate structures 118 are also shown. As will be further described, gate structures 110, 112 are part of transistors 120, 122. A bipolar junction transistor (BJT) area 126 of substrate 116 is also shown in which various BJTs 128 (only part shown in FIG. 1, see FIG. 4) and related structures may be formed.

Substrate 116 may include any now known or later developed semiconductor substrate typically used for integrated circuit (IC) structures. In the example shown, substrate 116 includes a bulk semiconductor substrate 130 including a semiconductor material having a variety of doped wells 132 therein. Doped wells 132 can include a variety of dopants, e.g., n-type or p-type, and have a variety of dopant concentrations, dependent on the type of transistor 120, 122 to be formed thereover. Doped wells 132 can be formed using any now known or later developed doping process, e.g., in-situ doping or ion implantation. Substrate 116 may include other forms of substrates such as but not limited to a semiconductor-on-insulator (SOI) substrate.

First and second gate structures 110, 112 (and other gate structures 118) are formed over substrate 116 using any now known or later developed semiconductor fabrication techniques. For example, material deposition, photolithography including patterning various masks and etching, planarization, doping (e.g., in-situ or ion implantation) among other processes, can be employed. Each of first and second gate structures 110, 112 (and other gate structures 118) includes a polysilicon body 140 having a lower surface 142, an oxide sidewall spacer layer 144 over polysilicon body 140, a nitride sidewall spacer layer 146 over oxide sidewall spacer layer 144, and an oxide protect layer 148 over nitride sidewall spacer layer 146. In certain embodiments, oxide sidewall spacer layer 144 may be omitted on sidewalls of polysilicon body 140. Polysilicon bodies 140 may include any dopants depending on type of transistor 120, 122 being formed. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped with a Group V dopant, such as arsenic (As), phosphorous (P) or antimony (Sb), to achieve N-type conductivity.

Transistors 120, 122 may also include source/drain regions 150 in substrate 116 below gate structures 110, 112 (and 118). Source/drain regions 150 also include dopants appropriate for transistor 120, 122 conductivity type. Oxide sidewall spacer layer 144 is also shown under polysilicon bodies 140 of gate structures 110, 112 where it functions as a gate dielectric layer. It will be recognized that other dielectric materials may be used for gate dielectric layer and sidewall spacer layer 144. Gate structures 110, 112 (118) form a channel 152 in substrate 116 between source/drain regions 150. As the formation of gate structures and their arrangements are well known to those with skill in the art no further description is necessary.

Gate structures 110, 112, 118 may be electrically isolated from other regions of substrate 116, e.g., BJT area 126, using any now known or later developed trench isolation 154. Trench isolations (TI) 154 include a trench etched into semiconductor substrate 116 and filled with an insulating material such as oxide, to isolate one region of the substrate from an adjacent region of the substrate. One or more transistors and/or passive devices may be disposed within an area isolated by TIs 154. Each TI 154 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, or layers thereof. TIs 154 may be provided as a shallow trench isolation (STI) or a deep trench isolation (DTI).

One or more dielectric layers 162 may be provided over substrate 116 between gate structures 110, 112, 118. In one example, as shown in FIG. 1, dielectric layer(s) 162 are over TI 154. Dielectric layer(s) 162 may include, for example, a nitride layer 164, which may be integral with nitride sidewall spacer layer 146, and/or an oxide layer 166, which may be integral with oxide protect layer 148, over substrate 116 (both shown). That is, nitride layer 164 may connect to and/or be part of nitride sidewall spacer layer 146, and oxide layer 166 may connect to and/or be part of oxide protect layer 148. Note, oxide sidewall spacer layer 144 is not present over TI 154. In other embodiments, TI 154 may be optional between gate structures 110, 112 (indicated by dashed lines on TI 154 between gate structures 110, 112). In these embodiments, dielectric layer(s) 162, such as nitride layer 164 and/or oxide layer 166, may be over an active region, e.g., of semiconductor substrate 130, of substrate 116.

FIG. 1 also shows a conventional polysilicon resistor 168. Polysilicon resistor 168 is formed at the same time as polysilicon bodies 140 of gate structures 110, 112, 118 and thus has the same lower surface 142 and height as polysilicon bodies 140. BJT area 126 is electrically isolated from FET area 114 by a TI 154X.

Figure 4:
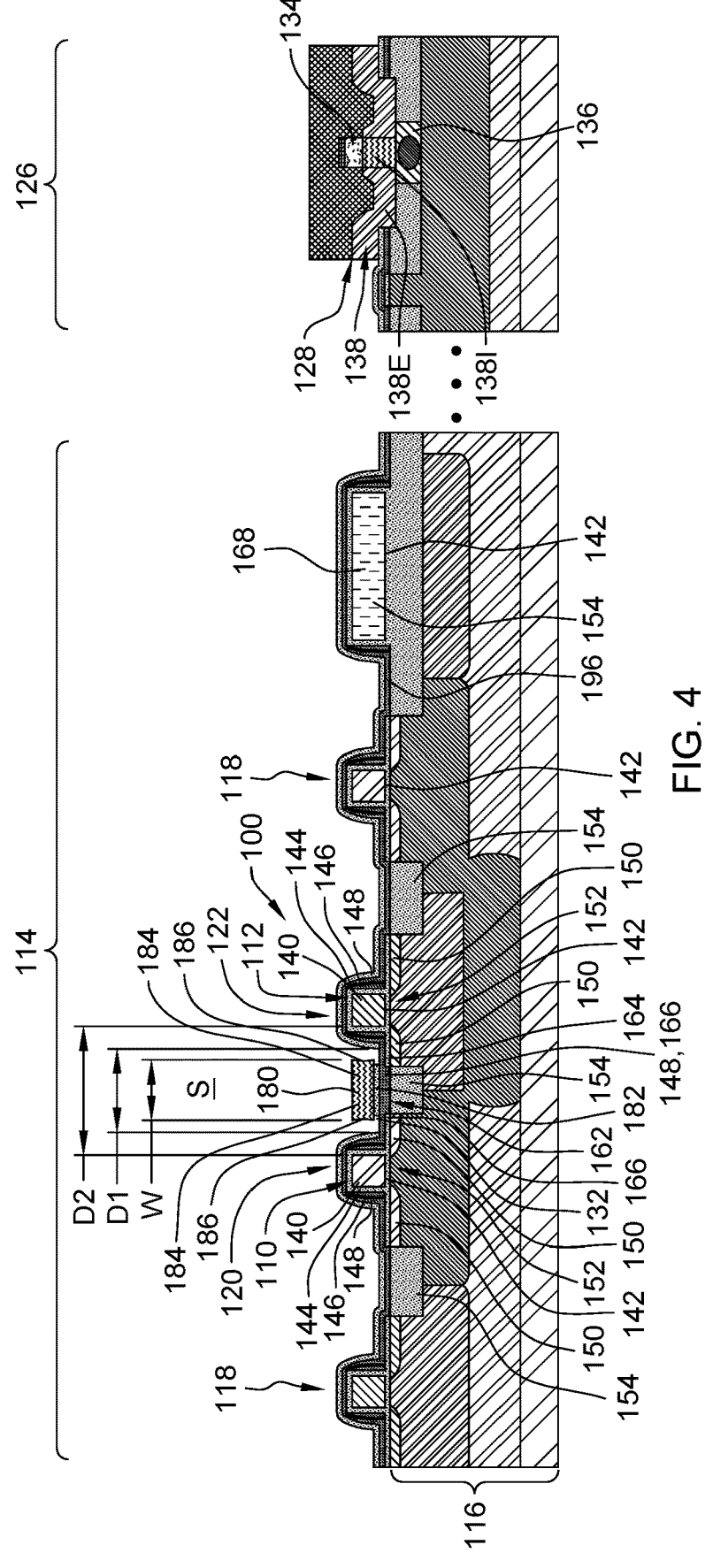
FIG. 4 shows a cross-sectional view of a structure after forming the polysilicon resistor and the second portion of the BJT, according to embodiments of the disclosure.

As part of fabrication of BJTs 128 (FIG. 4) in BJT area 126, a first polysilicon layer 158 and a second polysilicon layer 160 are formed over FET area 114, including gate structures 110, 112, 118, and over BJT area 126 of substrate 116. For example, FIG. 1 shows forming first polysilicon layer 158 and second polysilicon layer 160 over first gate structure 110 and second gate structure 112 in FET area 114 and over BJT area 126 of substrate 116. Second polysilicon layer 160 is formed over first polysilicon layer 158 prior to forming any polysilicon resistor. Dielectric layer(s) 162, e.g., nitride layer 164 and oxide layer 166, is/are between first polysilicon layer 158 and substrate 116. First polysilicon layer 158 and second polysilicon layer 160 may be deposited using any appropriate deposition technique, e.g., chemical vapor deposition, and may be doped with any appropriate dopant, e.g., in-situ during deposition, so as to have different type conductivities. More particularly, first polysilicon layer 158 may include any dopants required for polysilicon resistor 180 and/or a first portion of BJT 128 (FIG. 4), e.g., a base 138 (FIG. 4), in which it is used. Further, second polysilicon layer 160 may include any dopants required for a second portion of BJT 128 (FIG. 4), e.g., an emitter 134 (FIG. 4), in which it is used. For purposes of description, as shown in FIG. 4, BJT 128 is an NPN transistor including an n-type emitter 134, an n-type collector 136, and a p-type base 138. In the example shown in the drawings, first polysilicon layer 158 may be an undoped (intrinsic) or p-type polysilicon layer that will be used to form p-type base 138 (FIG. 4) of BJT 128 (FIG. 4), and second polysilicon layer 160 may be an n-type polysilicon layer that will be used to form n-type emitter 134. It is noted that BJT 128 (FIG. 4) could alternatively be an PNP transistor including a p-type emitter, a p-type collector and an n-type base. In this case, the first polysilicon layer can be an undoped (intrinsic) or n-type polysilicon layer that will be used to form the n-type base and the second polysilicon layer can be a p-type polysilicon layer for the p-type emitter.

While shown as single layers, first polysilicon layer 158 and second polysilicon layer 160 may include a number of polysilicon layers having different characteristics, e.g., thickness, dopant concentrations, etc. During conventional processing, second polysilicon layer 160 is typically patterned to form a portion of BJTs 128 (FIG. 4) in BJT area 126, e.g., emitter 134, but removed from over FET area 114. Further, during conventional processing, first polysilicon layer 158 is typically patterned to form another portion of BJTs 128 (FIG. 4) in BJT area 126, e.g., base 138, but removed from over FET area 114. In contrast, in accordance with embodiments of the disclosure, first polysilicon layer 158 is used to form a polysilicon resistor 180 between first and second gate structures 110, 112 using a remnant of second polysilicon layer 160 left over from forming, for example, emitter 134 (FIG. 4) of BJT 128 in BJT area 126.

Figure 2:
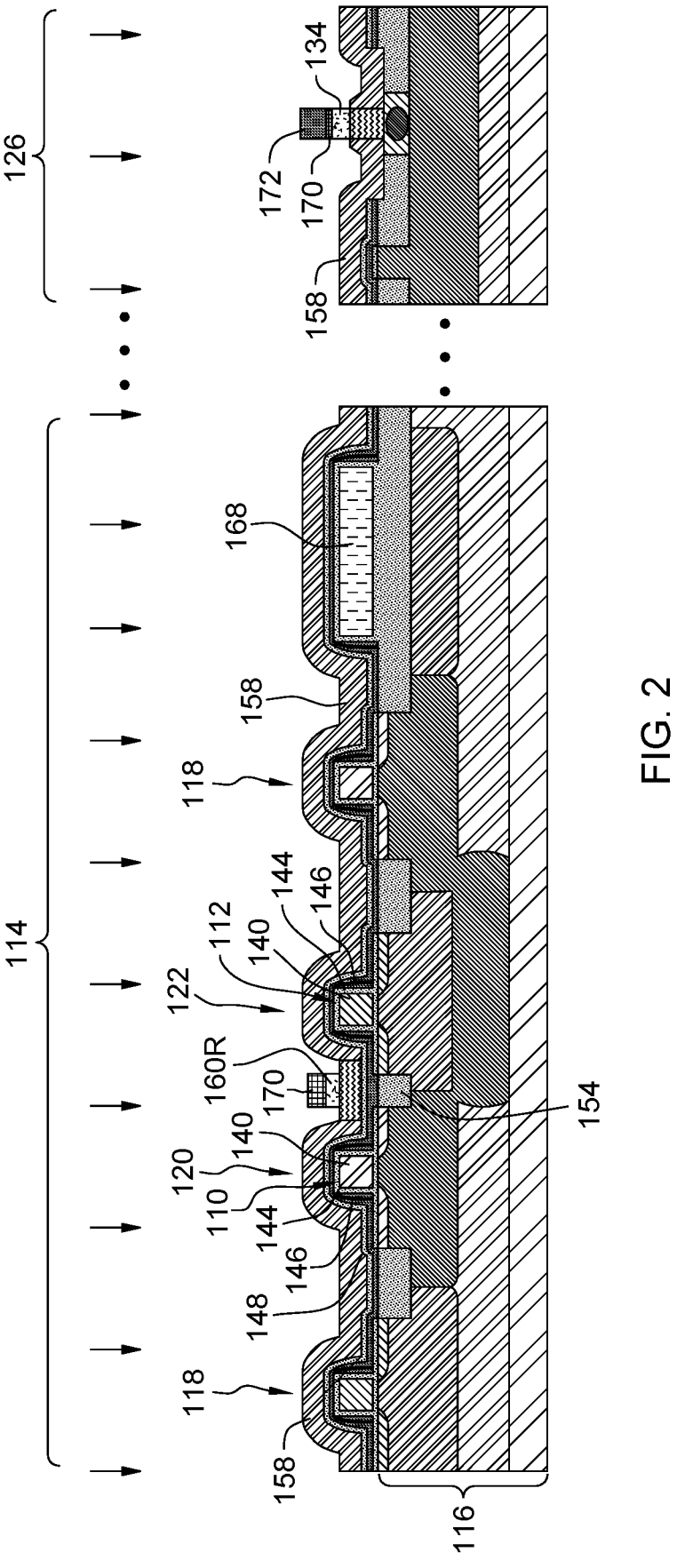
FIG. 2 shows a cross-sectional view of forming a mask for a polysilicon resistor and a first portion of a bipolar junction transistor (BJT), according to embodiments of the disclosure.

Referring to FIGS. 1 and 2, first and second gate structures 110, 112 are separated by a space S. A dimension of space S is defined by a distance D1 between oxide protect layers 148 of first gate structure 110 and second gate structure 112, i.e., between lower corners thereof. Distance D1 is, in turn, defined by a distance D2 between polysilicon body 140 of first gate structure 110 and polysilicon body 140 of second gate structure 112, i.e., a polyconductor (PC) spacing in a particular area within FET area 114. Distance D1 determines whether a polysilicon resistor 180 can be formed in a self-aligned manner between adjacent gate structures 110, 112. More particularly, distance D1 cannot be so small that second polysilicon layer 160 does not remain therein over first polysilicon layer 158 during patterning of emitter 134 (FIG. 4) of BJT 128 (FIG. 4) from second polysilicon layer 160. Similarly, distance D1 cannot be so large that gate structures 110, 112 fail to define a size of polysilicon resistor 180. In this latter case, as will be further described, a mask 174 (FIG. 5) can still be used to size polysilicon resistor 180, but the resistor is not self-aligned by adjacent structures. Where distance D2 between polysilicon body 140 of first gate structure 110 and polysilicon body 140 of an adjacent second gate structure 112 is in a range of 500 to 1000 nanometers (nm), a polysilicon resistor 180 can be formed therebetween. Where distance D2 is smaller than 500 nm, a mask 170 does not form sufficiently over first polysilicon layer 158, or second polysilicon layer 160 does not fill space S. Where distance D2 is larger than 1000 nm, the mask must be sized to pattern first polysilicon layer 158.

FIGS. 1-4 also show, using first polysilicon layer 158, to form polysilicon resistor 180 in space S between first gate structure 110 and second gate structure 112 and a first portion of BJT 128 (FIG. 4) in BJT area 126 of substrate 116. More particularly, FIG. 1 shows forming mask 170 over areas in which second polysilicon layer 160 is to remain, e.g., to form emitter 134 (FIG. 4) of BJT 128 (FIG. 4) and, eventually, polysilicon resistor 180 (FIG. 4). Mask 170 may include any now known or later developed masking material such as but not limited to photoresist (resist) and nitride. In one example, mask 170 may include (none individually labeled for clarity) a developable organic planarization layer (OPL) on polysilicon layers 158, 160 to be etched, a developable anti-reflective coating (ARC) layer on the developable OPL, and a photoresist mask layer on the developable ARC layer. An etch process (arrows) used in FIG. 2 for second polysilicon layer 160 may include any appropriate etching step(s) appropriate for second polysilicon layer 160, e.g., a reactive ion etch, that is selective for second polysilicon layer 160 over first polysilicon layer 158 (e.g., given the conductivity type of the second polysilicon layer). For example, in the case of an NPN BJT 128, the etch process can be an anisoptropic etch process (e.g., a plasma etch process) selective to n-type polysilicon of second polysilicon layer 160 over the undoped or p-type polysilicon of first polysilicon layer 158.

As shown in FIG. 2, after etching, emitter 134 is formed in BJT area 126 and a portion or remnant 160R of second polysilicon layer 160 (FIG. 1) remains between first and second gate structures 110, 112. Hence, FIG. 2 shows using second polysilicon layer 160 to form a portion of BJT 128, e.g., emitter 134, in BJT area 126 of substrate 116, leaving portion 160R of second polysilicon layer 160 between first and second gate structures 110, 112. A portion of mask 170 may also be present over portion 160R, but this is not necessary in all cases, e.g., where the etching removes all of mask 170. Where desired, mask 170 may be removed using any known or later developed removal process appropriate for the mask material, e.g., a wet etch for hard nitride mask or an ashing process (oxygen dry strip process) for a soft resist-based mask.

At this stage, with mask 170 remaining over portion 160R in FET area 114 and perhaps part of a photoresist 172 over mask 170 and emitter 134 in BJT area 126, an optional doping may be conducted of first polysilicon layer 158. The doping may include any now known or later developed doping process, e.g., ion implantation, to modify a dopant concentration of first polysilicon layer 158. In one non-limiting example, where BJT 128 is an NPN transistor, exposed portions of the first polysilicon layer 158 may be doped with a p-type dopant to increase the p-type dopant concentration thereof while leaving a portion thereof under emitter 134 undoped or doped with a lower dopant concentration of the p-type dopant. This process, as shown in FIG. 3, forms an intrinsic base 138I and extrinsic base 138E and increases dopants in eventually-formed polysilicon resistor 180.

Figure 3:
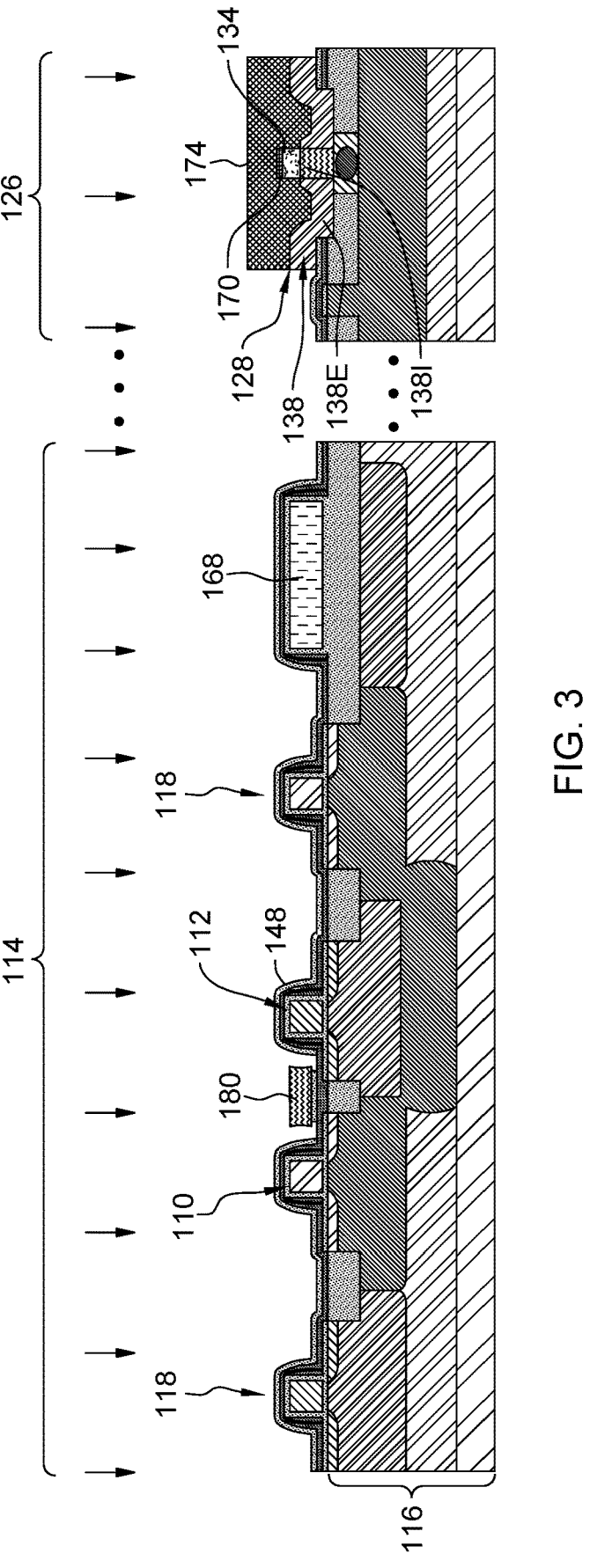
FIG. 3 shows a cross-sectional view of forming a polysilicon resistor and a second portion of the BJT, according to embodiments of the disclosure.

FIG. 3 shows forming polysilicon resistor 180 includes using portion 160R (FIG. 2) of second polysilicon layer 160 (and any remaining mask 170 (FIG. 2)) between first and second gate structures 110, 112 as a mask for first polysilicon layer 158. The process includes etching first polysilicon layer 158 using any appropriate etching process for the material of first polysilicon layer 158, e.g., a RIE. As shown in FIG. 3, prior to the etching, another mask 174, e.g., a photoresist or other masking material, may be formed in BJT area 126 to further define structures therein, e.g., base 138, during the etching process.

FIG. 4 shows a cross-sectional view of structure 100 including polysilicon resistor 180. Polysilicon resistor 180 has a number of physical characteristics different than conventional polysilicon resistor 168. For example, because first polysilicon layer 158 is formed over dielectric layer(s) 162 over substrate 116 (e.g., TI 154 or semiconductor substrate 130) between gate structures 110, 112, polysilicon resistor 180 has a lower surface 182 that is farther from substrate 116 (latter defined by an upper surface of semiconductor substrate 130), than lower surfaces 142 of polysilicon bodies 140 of first and second gate structures 110, 112, 118. In addition, as shown in FIG. 4, lower surface 182 of polysilicon resistor 180 is farther from substrate 116 than lower surface 142 of conventional polysilicon resistor 168.

In another example, as shown in FIG. 4, nitride layer 164 extends under an entirety of a width W of polysilicon resistor 180, but oxide layer 166 (e.g., as part of oxide protect layer 148) extends only partially under width W of polysilicon resistor 180. This undercutting of polysilicon resistor 180 is caused by exposure of oxide layer 166 to the etching of first polysilicon layer 158, which partially removes it from under polysilicon resistor 180. The etch process removes part of oxide protect layer 148 over nitride sidewall spacer layer 146, but does not fully remove it.

Polysilicon resistor 180 also includes end portions 184 cantilevered over oxide layer 166 (part of oxide protect layer 148). In addition, opposite sidewalls 186 of polysilicon resistor 180 have a concave surface, i.e., due to the etching process between gate structures 110, 112. In another example, first polysilicon layer 158, and thus, polysilicon resistor 180 may have a different polarity dopant compared to at least one of the polysilicon bodies 140 of first and second gate structures 110. For example, where BJT 128 is an NPN transistor, dopants may be p-type for polysilicon resistor 180 and base 138 and n-type for polysilicon bodies 140 of one or more of gate structures 110, 112. Despite being made of a different first polysilicon layer 158 than polysilicon bodies 140 of gate structures 110, 112, polysilicon resistor 180 is still between polysilicon bodies 140. More particularly, at least some portion polysilicon bodies 140 of gate structures 110, 112 and polysilicon resistor 180 overlap in a vertical direction.

Figure 5:
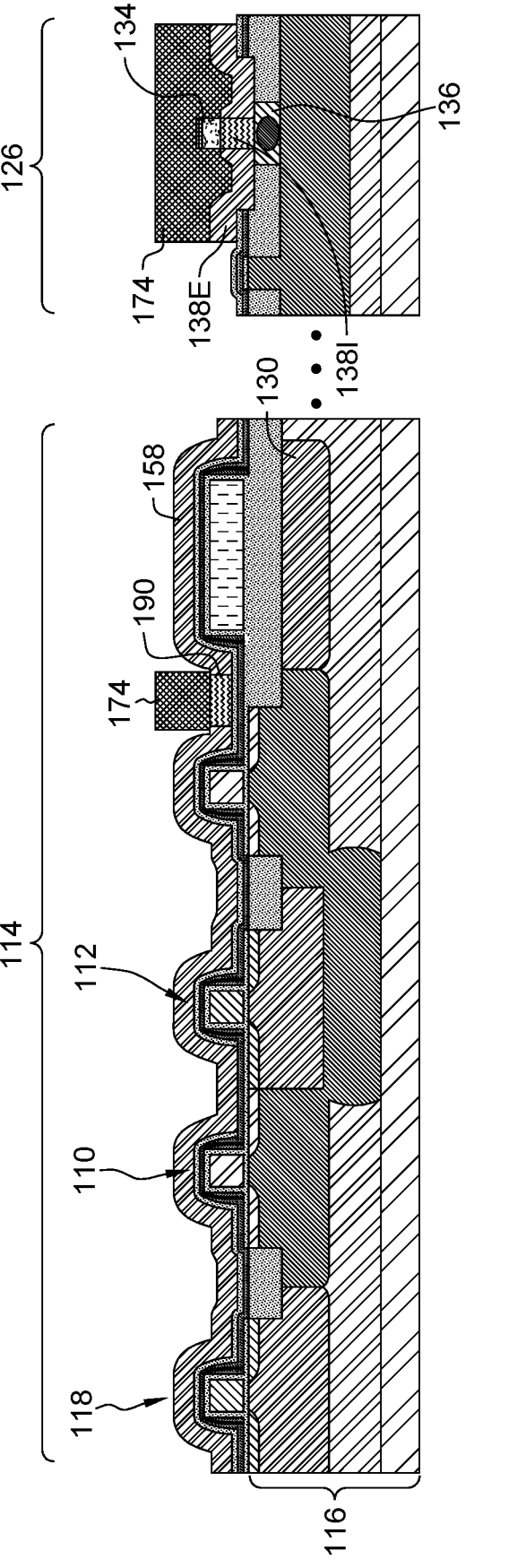
FIG. 5 shows a cross-sectional view of forming a mask for a polysilicon resistor, according to alternative embodiments of the disclosure.
Figure 6:
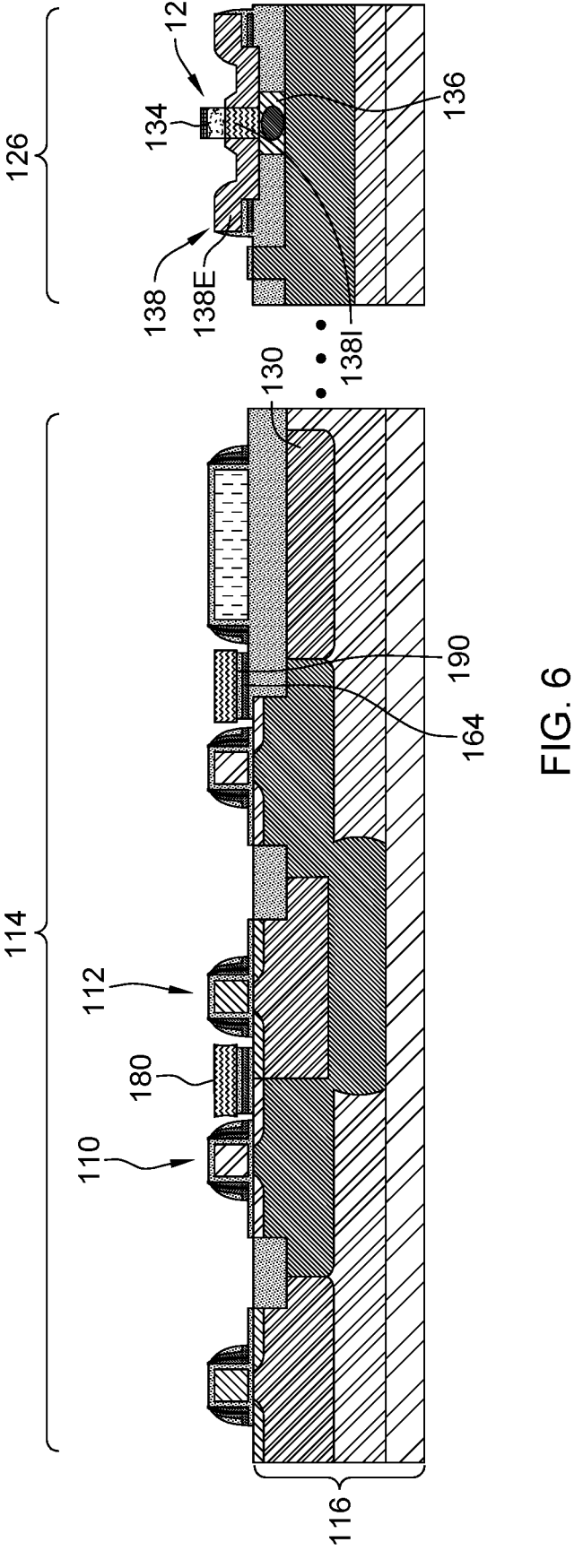
FIG. 6 shows a cross-sectional view of forming the polysilicon resistor and a portion of the BJT, according to embodiments of the disclosure.

FIGS. 5-6 show cross-sectional views of an alternative embodiment of a method in which a polysilicon resistor 190 is formed using first polysilicon layer 158 in locations that are larger than can provide portion 160R (FIG. 2). In this case, photoresist mask 174 may be used to size polysilicon resistor 190 from first polysilicon layer 158 during the etching that forms p-type base 138 of BJT 128 (FIG. 6). As noted, BJT 128 (FIG. 6) could alternatively be a PNP transistor. In accordance with embodiments of the disclosure, first polysilicon layer 158 is used to form polysilicon resistor 190 on substrate 116, for example, between a gate structure 118 and conventional polysilicon resistor 168. Polysilicon resistor 190 could alternatively be formed in other parts of FET area 114, such as between gate structure 110, 118 (far left side, not shown) that are too far apart to accommodate self-aligned polysilicon resistor 180. Polysilicon resistor 190 rather than being self-aligned between gate structures 110, 112 is patterned using mask 174 and an etching process, e.g., a RIE. Here, a space between structures may be too large, e.g., greater than 1000 nm, requiring mask 174 to be used to size polysilicon resistor 190. Mask 174 may include any now known or later developed masking material such as previously described relative to mask 170 (FIG. 2) or mask 174 (FIG. 3). As noted, mask 174 may also be used to pattern base 138 of BJT 128 in BJT area 126. Polysilicon resistor 190 has a lower surface 196 farther from substrate 116, i.e., an upper surface of semiconductor substrate 130, than lower surfaces 142 of polysilicon bodies 140 of first and second gate structures 110, 112 or conventional polysilicon resistor 168. Polysilicon resistor 190 can be used alone or with polysilicon resistor 180 (latter shown in FIG. 6). The dopants in first polysilicon layer 158 can be selected for the particular part of BJT 128 in which used and/or the desired polysilicon resistor 180, 190 in which used.

Figure 7:
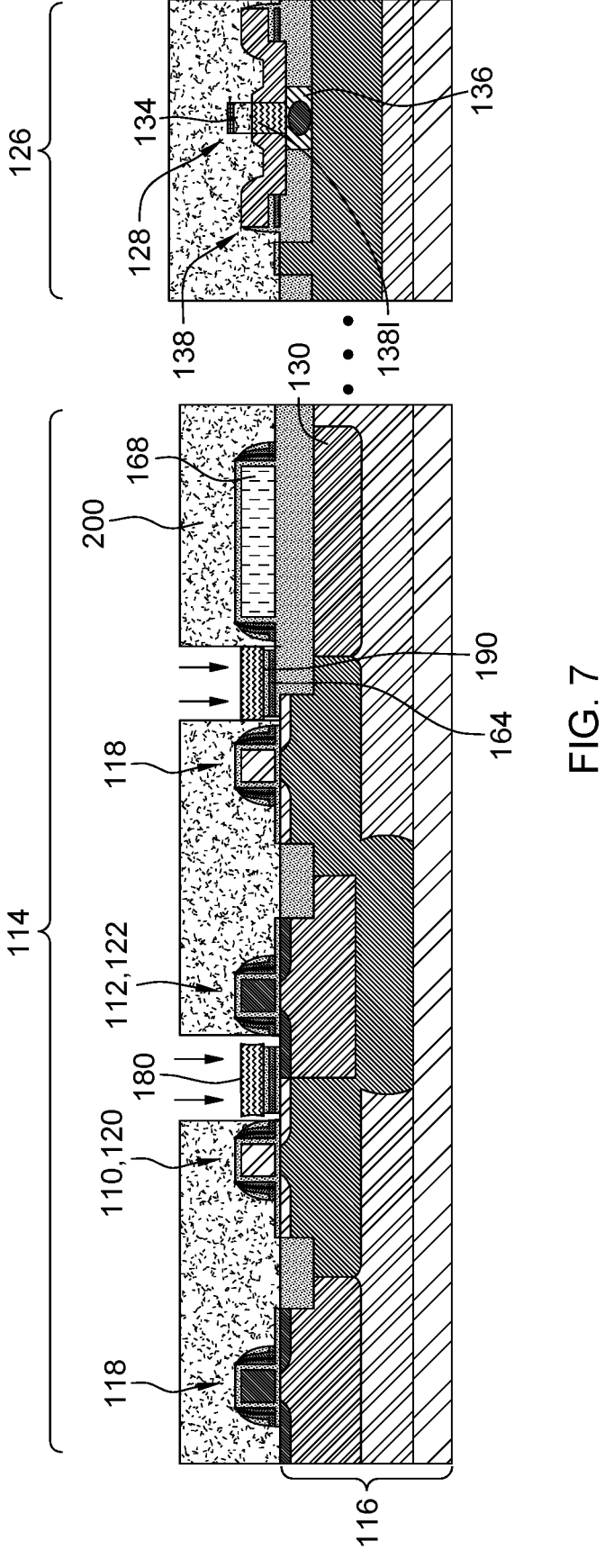
FIG. 7 shows a cross-sectional view of an optional step of a method of modifying a polysilicon resistor for a structure, according to embodiments of the disclosure.

FIG. 7 shows a cross-sectional view of an optional step of doping one or more of polysilicon resistors 180, 190, i.e., after formation thereof. As shown, a mask 200 may be patterned exposing one or more polysilicon resistors 180, 190 and a doping performed to change the dopant concentration of the resistor(s) 180 and/or 190. Mask 200 may include any now known or later developed masking material such as previously described relative to mask 170 or 174. In this manner, where first polysilicon layer 158 is formed for use in BJT 128, e.g., as base 138, polysilicon resistor 180, 190 formed thereby can be later modified to have the dopant concentrations desired for the resistor, i.e., to provide the desired resistance values.

Subsequent processing relative to any polysilicon resistor 180, 190 may include forming contacts through interlayer dielectric (ILD) layer(s) to polysilicon resistor 180, 190. The ILD layer(s) may fill under polysilicon resistor 180. The ILD material can include, for example, one or more layers of silicon dioxide, silicon nitride, a doped silicon glass (e.g., phosphosilicate glass (PSG) or borophosphosilicate glass (BPSG)), or any other suitable ILD material. Pairs of contacts can be positioned at any desired locations along a length of polysilicon resistors 180, 190 (into and out of page) to create the desired resistance value. As this processing is well known to those with ordinary skill in the art, no further details are necessary.

Polysilicon resistors 180, 190 may have a resistance similar to conventional resistor materials, for example, 340+/−40 Ohms/square nanometer. The resistance can be modified based on thickness, base material and/or dopant concentration of first polysilicon layer 158 along with any implant after resistor formation, as described relative to FIG. 7.

Referring again to FIG. 4, structure 100 according to embodiments of the disclosure will be further described. Structure 100 includes first gate structure 110 spaced from second gate structure 112 in FET area 114 of a substrate 116. Structure 100 also includes polysilicon resistor 180 in a space between first gate structure 110 and second gate structure 112. Polysilicon resistor 180 may have at least a portion of opposite sidewalls 186 spaced from first and second gate structures 110, 112, i.e., oxide sidewall spacer layer 148 thereof. That is, polysilicon resistor 180 is self-aligned with but spaced from first and second gate structures 110, 112. As noted, each of first and second gate structures 110, 112 (and other gate structures 118) includes polysilicon body 140 having lower surface 142, oxide sidewall spacer layer 144 over polysilicon body 140, nitride sidewall spacer layer 146 over oxide sidewall spacer layer 144, and an oxide protect layer 148 over nitride sidewall spacer layer 146. Polysilicon body 140 may include any dopants depending on type of transistor 120, 122 being formed. Transistors 120, 122 may also include source/drain regions 150 in substrate 116 below gate structures 110, 112 (and 118). Source/drain regions 150 include dopants depending on transistor 120, 122 type. Gate structures 110, 112 (118) form channel 152 in substrate 116 between source/drain regions 150. Distance D2 between polysilicon body 140 of first gate structure 110 and polysilicon body 140 of second gate structure 112 may in a range of 500 to 1000 nm, which allows for formation of polysilicon resistor 180 therebetween. Nitride layer 164 (nitride sidewall spacer layer 146) extends under an entirety of width W of polysilicon resistor 180, and oxide layer 166 (oxide sidewall spacer layer 148) extends only partially under width W of polysilicon resistor 180. Polysilicon resistors 180, 190 have lower surfaces 182, 196, respectively, farther from substrate 116, i.e., an upper surface of semiconductor substrate 130, than lower surfaces 142 of polysilicon bodies 140 of first and second gate structures 110, 112. Opposite sidewalls 186 of polysilicon resistor 180 have a concave surface. One or both polysilicon resistors 180, 190 have a different polarity dopant compared to at least one of polysilicon bodies 140 of first and second gate structures 110, 112. In certain embodiments, despite polysilicon resistor(s) 180, 190 being formed from the same first polysilicon layer 158 as a respective part of BJT 128, one or both resistors may be subsequently modified, as described relative to FIG. 7, so they have a different dopant concentration compared to the respective part of BJT 128. Polysilicon resistor 180 is part of first polysilicon layer 158 used for, e.g., base 138, of BJT 128 in BJT area 126 of substrate 116. Similarly, polysilicon resistor 190 is also part of first polysilicon layer 158 used for, e.g., base 138, of BJT 128 in BJT area 126 of substrate 116. Polysilicon resistor 180 includes lower surface 182 in direct contact with at least one dielectric layer 162 on substrate 116, e.g., TI 154 or semiconductor substrate 130.

In the method described herein, BJT 128 formation in BJT area 126 using polysilicon layers 158, 160 has been described. It will be recognized that polysilicon layers 158 and 160 may be used to form additional structures in BJT area 126 concurrently or simultaneously to BJT 128. For example, as will be recognized by those with skill in the art, polysilicon layers 158, 160 may also be patterned in BJT area 126 to form parts of, for example, other BJTs, a varactor, among other structures.

In the structures and method described above, a semiconductor material refers to a material whose conducting properties can be altered by doping with an impurity. Semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

Embodiments of the disclosure provide various technical and commercial advantages, examples of which are discussed herein. Polysilicon resistor 180 and method of manufacture provide a self-aligned resistor between gate structures 110, 112 that does not require any additional mask steps (uses mask 170 used for BJT area), saving time and expense of fabricating the resistors. Similarly, where the spacing between structures does not allow self-alignment, a mask 174 used for BJT area 126 can be used to form polysilicon resistor 190, which also does not require any additional mask steps, saving time and expense of fabricating the resistors.

The structure and method as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure, comprising:
a first gate structure spaced from a second gate structure in a field effect transistor (FET) area of a substrate, the first and second gate structures each including a polysilicon body; and
a polysilicon resistor in a space between the first gate structure and the second gate structure, wherein the polysilicon resistor has a lower surface that is farther from the substrate than lower surfaces of the polysilicon bodies of the first and second gate structures and wherein the polysilicon resistor is in a same polysilicon layer as a base of a bipolar junction transistor (BJT) in a bipolar junction transistor area of the substrate.

2. The structure of claim 1, wherein each of the first and second gate structures further includes an oxide sidewall spacer layer over the respective polysilicon body, a nitride sidewall spacer layer over the oxide sidewall spacer layer and an oxide protect layer over the nitride sidewall spacer layer.

3. The structure of claim 2, wherein a distance between the polysilicon body of the first gate structure and the polysilicon body of the second gate structure is in a range of 500 to 1000 nanometers (nm).

4. The structure of claim 2, wherein the nitride sidewall spacer layer extends under an entirety of a width of the polysilicon resistor, and the oxide protect layer extends only partially under the width of the polysilicon resistor.

5. The structure of claim 1, wherein the polysilicon resistor has at least a portion of opposite sidewalls spaced from the first and second gate structures.

6. The structure of claim 1, wherein the polysilicon resistor has a different polarity dopant compared to at least one of the polysilicon bodies of the first and second gate structures.

7. The structure of claim 1, wherein the opposite sidewalls of the polysilicon resistor have a concave surface.

8. The structure of claim 1, wherein the polysilicon resistor includes a lower surface in direct contact with at least one dielectric layer on the substrate.

9. A structure, comprising:
a field effect transistor (FET) area of a substrate including a first gate structure spaced from a second gate structure, wherein each of the first and second gate structures includes a polysilicon body having a lower surface; and
a self-aligned polysilicon resistor in a space between the first gate structure and the second gate structure, wherein the self-aligned polysilicon resistor has a lower surface that is farther from the substrate than the lower surfaces of the polysilicon bodies of the first and second gate structures and wherein the polysilicon resistor is in a same polysilicon layer as a base of a bipolar junction transistor (BJT) in a bipolar junction transistor area of the substrate.

10. The structure of claim 9, wherein each of the first and second gate structures further includes an oxide sidewall spacer layer over the respective polysilicon body, a nitride sidewall spacer layer over the oxide sidewall spacer layer and an oxide protect layer over the nitride sidewall spacer layer, wherein the nitride sidewall spacer layer extends under an entirety of a width of the self-aligned polysilicon resistor, and the oxide protect layer extends only partially under the width of the self-aligned polysilicon resistor.

11. The structure of claim 9, wherein the self-aligned polysilicon resistor has a different polarity dopant compared to at least one of the polysilicon bodies of the first and second gate structures.

12. The structure of claim 9, wherein the opposite sidewalls of the self-aligned polysilicon resistor have a concave surface.

13. A method, comprising:
forming a first gate structure spaced from a second gate structure over a field effect transistor (FET) area of a substrate;
forming a first polysilicon layer over the first gate structure and the second gate structure and over a bipolar junction transistor area of the substrate, the first polysilicon layer filling a space between the first gate structure and the second gate structure; and using the first polysilicon layer, forming a polysilicon resistor in a space between the first gate structure and the second gate structure and forming a first portion of a bipolar junction transistor (BJT) in a bipolar junction transistor area of the substrate.

14. The method of claim 13, wherein each of the first and second gate structures includes a polysilicon body having a lower surface, an oxide sidewall spacer layer over the respective polysilicon body, a nitride sidewall spacer layer over the oxide sidewall spacer layer, and an oxide protect layer over the nitride sidewall spacer layer, wherein the nitride sidewall spacer layer extends under an entirety of a width of the polysilicon resistor, and the oxide layer extends only partially under the width of the polysilicon resistor.

15. The method of claim 13, wherein opposite sidewalls of the polysilicon resistor have a concave surface.

16. The method of claim 13, wherein the polysilicon resistor has a lower surface that is farther from the substrate than the lower surfaces of the polysilicon bodies of the first and second gate structures.

17. The method of claim 13, further comprising doping the polysilicon resistor.

18. The method of claim 13, further comprising:

prior to forming the polysilicon resistor: forming a second polysilicon layer over the first polysilicon layer, and using the second polysilicon layer, forming a second portion of the BJT in the bipolar junction transistor area of the substrate, leaving a portion of the second polysilicon layer between the first and second gate structures, wherein forming the polysilicon resistor includes using the portion of the second polysilicon layer between the first and second gate structures as a mask for the first polysilicon layer.

19. The structure of claim 1, wherein the bipolar junction transistor is electrically isolated from the FET area.

20. The structure of claim 9, wherein a distance between the polysilicon body of the first gate structure and the polysilicon body of the second gate structure is between approximately 500 to approximately 1000 nanometers (nm).

* * * * *